United States Patent
Acatrinei

[19]

[11] Patent Number: 6,111,335
[45] Date of Patent: Aug. 29, 2000

[54] PIEZOELECTRIC INTERFACE ANALYZER

[75] Inventor: Benjamin Acatrinei, Sunnyvale, Calif.

[73] Assignee: Beniamin Acatrinei, San Diego, Calif.

[21] Appl. No.: 08/173,976

[22] Filed: Dec. 28, 1993

[51] Int. Cl.[7] .................................................. H01L 41/08
[52] U.S. Cl. ........................................................ 310/316.03
[58] Field of Search ..................................... 310/316–318

[56] References Cited

U.S. PATENT DOCUMENTS

| | | | |
|---|---|---|---|
| 3,872,330 | 3/1975 | Miller et al. ............................. | 310/316 |
| 4,109,174 | 8/1978 | Hodgson ................................. | 310/316 |
| 4,404,502 | 9/1983 | Magori et al. .......................... | 318/116 |
| 4,520,289 | 5/1985 | Sato et al. ............................... | 310/316 |
| 4,732,129 | 3/1988 | Takigawa et al. ................... | 310/316 X |
| 4,767,959 | 8/1988 | Sakakibara et al. ................ | 310/316 X |
| 5,095,256 | 3/1992 | Ueyama et al. ..................... | 310/316 X |
| 5,130,598 | 7/1992 | Verheyen et al. ...................... | 310/316 |
| 5,190,383 | 3/1993 | Suzuki et al. ....................... | 310/316 X |
| 5,208,505 | 5/1993 | Mitsuyasu ........................... | 310/316 X |
| 5,361,014 | 11/1994 | Antone et al. .......................... | 310/316 |
| 5,477,831 | 12/1995 | Akaki et al. ........................ | 310/316 X |
| 5,479,062 | 12/1995 | Yoshino ................................. | 310/316 |

*Primary Examiner*—Mark O. Budd
*Attorney, Agent, or Firm*—Fish & Richardson P.C.

[57] ABSTRACT

The invention relates to a method and apparatus for testing the motor and generator properties of a piezoelectric transducer; for evaluating the effects of an interface between an object of study and the piezoelectric element; and for analyzing the resonance frequencies of the object of study.

The method consists of isolating and analyzing the freely oscillating decay signal of a piezoelectric transducer. This signal provides the standard for evaluating the piezoelectric transducer. This signal can also be compared with the freely oscillating decay signal of the transducer connected to an object for the purpose of analyzing the interface between the transducer and the object and the resonance frequencies of the object.

To isolate the freely oscillating decay signal of the transducer, an apparatus may be used employing a square wave generator suppling an electric pulse through an electronic switch to a piezoelectric transducer. This causes the transducer to oscillate periodically and emit a signal when the pulse is applied and when it is released. The electronic switch cuts off the stress impulse, allowing the transducer to oscillate freely. The combined signal from the square wave generator and the transducer is then amplified and limited by a limit comparator and amplifier. This reduces the size of the square wave impulse and amplifies the transducer signal. The remainder of the square wave impulse is eliminated from the output signal permitting discrete analysis of the transducer signal.

12 Claims, 3 Drawing Sheets

BLOCK DIAGRAM

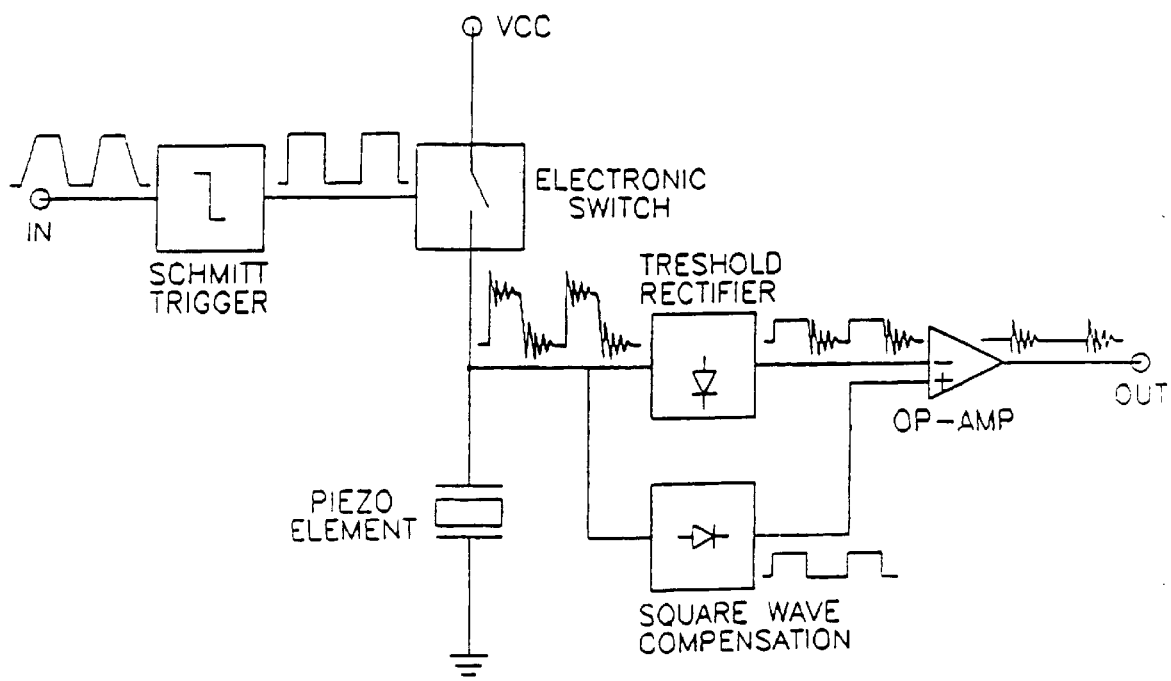
FIGURE 1: BLOCK DIAGRAM

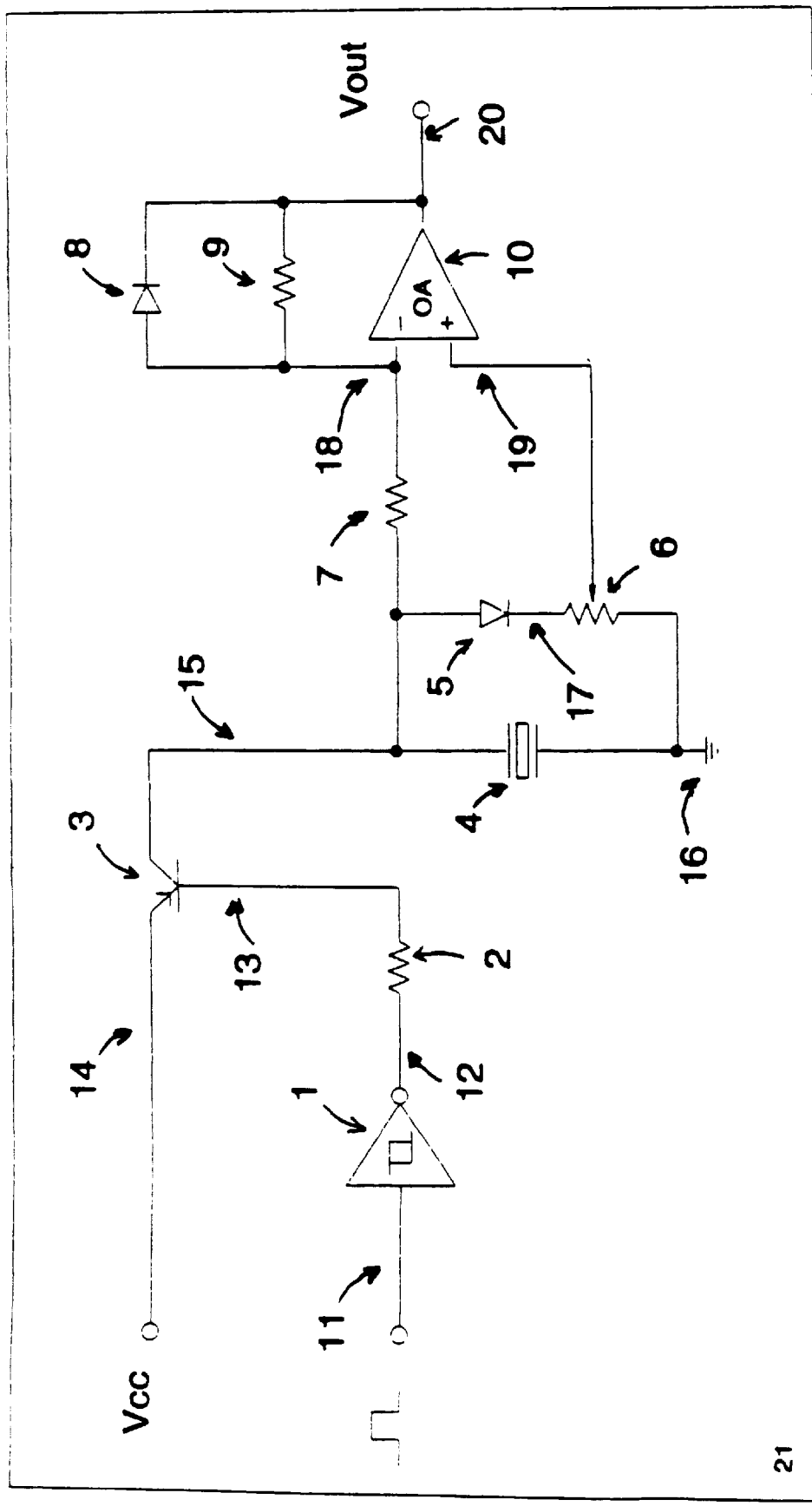
FIGURE 2 : Apparatus - Minimum parts embodiment

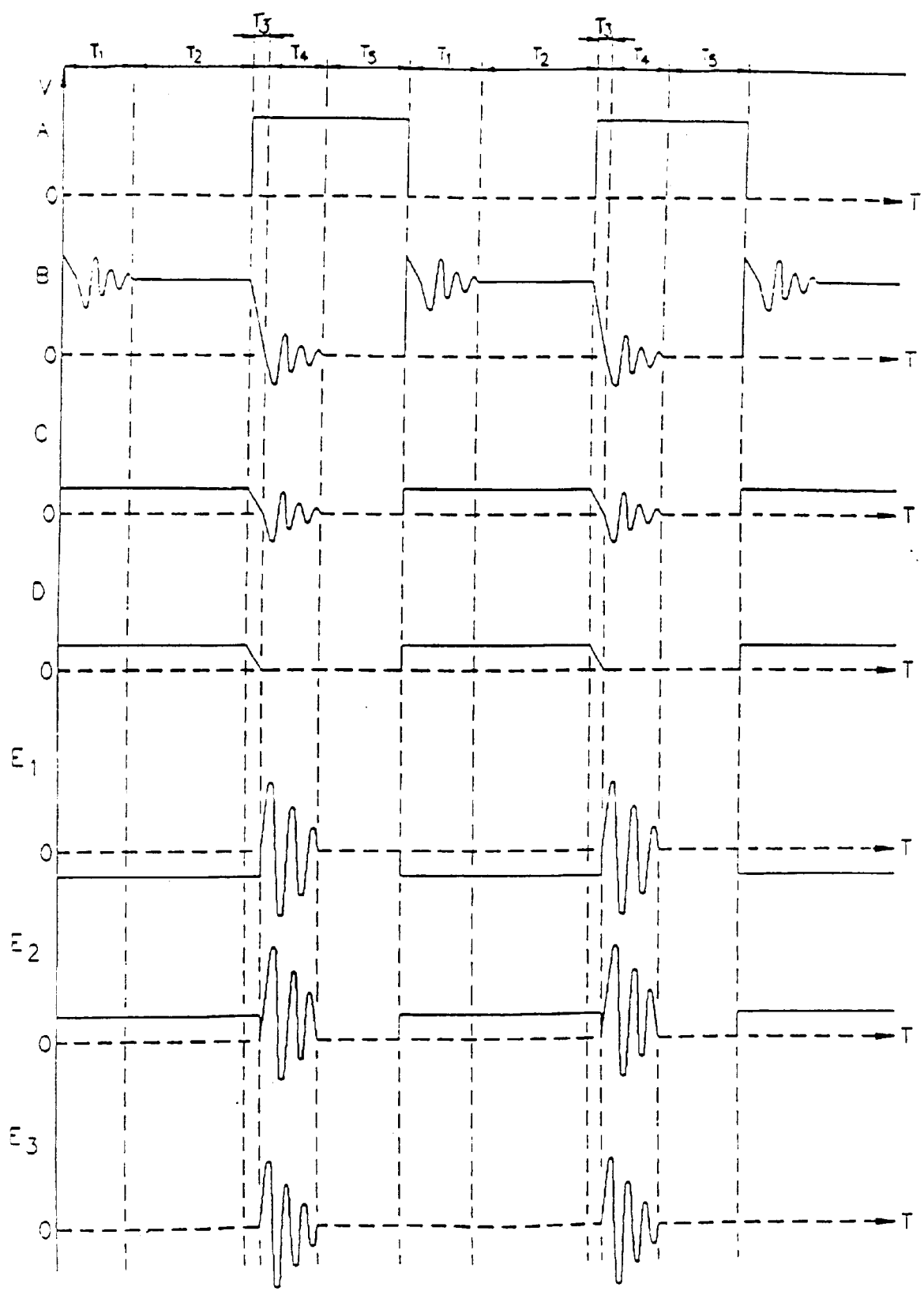
FIGURE 3: WAVEFORM DIAGRAMS

PIEZOELECTRIC INTERFACE ANALYZER

BACKGROUND OF THE INVENTION

The invention relates to a method and an apparatus for testing and analyzing piezoelectric transducers, and monitoring sensor devices employing piezoelectric transducers. These devices are used in the detection of changes in stress, pressure, temperature, acceleration, acoustic emissions, and infra and ultra sound motions. Piezoelectric transducers emit an electrical signal when subjected to variations of stress, pressure, temperature, acceleration, etc. In most applications, piezoelectric transducers are bonded or fixed to a surface. The characteristics of the interface between the crystal and the surface can distort and attenuate the signal emitted, by exerting additional stress. As the size of the piezoceramic transducer is reduced, the signal becomes smaller and more difficult to detect and analyze, while the effect of the interface is substantially increased. In some cases the initial stress generated through the interface is so great that the transducer properties are lost. It is desirable to have a procedure to analyze the transducer and the effects of an interface in order to determine if the transducer is functioning satisfactorily. Many applications of piezoelectric transducers involve detection or monitoring of very small variations in stress, pressure, temperature, and acceleration. Under current systems of analysis these small variations cannot be detected because the signal to noise ratio of the transducer becomes critical. It is desirable to have a procedure that permits easy analysis of these very small variations.

Piezoelectric transducers are used for monitoring of machinery, processes or structures, and are installed for long term monitoring of machinery, processes or structures. In such long term monitoring, it is desirable to have a procedure to evaluate various stresses without putting the machinery into operation, particularly where the transducer is employed for detecting internal fractures and fissures in metal components.

Common methods used to monitor and analyze piezoelectric transducer signal properties generally involve physical mechanical shock fixtures, ultrasound exciters, air pressure shocks, electrical shock and evaluation of the transducer as an electronic component using electric waves. All of these methods affect either the motor effect, or the generator effect of the piezoelectric transducer, or both, by applying a constant or permanent initial stress to the transducer. This does not allow the transducer free to emit its own signal and renders it insensitive to very small external stress which is the subject of analysis. Consequently these testing methods do not allow measurement or analysis of the transducer without the presence of the effects generated by the testing method, do not allow measurement or analysis of the stress on the transducer from the fixture or bonding interface, and do not allow measurement of the system stress or effect on the transducer. None of these testing methods allow evaluation of resonance frequencies of the objects in contact with the transducer when the interface fixture or bonding stress is too great. Finally in the case of electric pulse test methods and apparatus, the condenser properties of many piezoelectric materials prevent analysis of the signal because a component of the shock wave is retained by the piezoelctric transducer.

SUMMARY OF THE INVENTION

The present invention seeks to provide a novel method and apparatus for testing, monitoring and analyzing the characteristics of the signal emitted by piezoelectric transducers free of initial stresses and allows analysis and evaluation of external stresses under static conditions. It also allows the monitoring, analysis and testing of stress from fixture or bonding interface and the measurement of system stress on the transducer. The method employed is to apply an electrical shock to the transducer which may be the object of study or may be affixed to the object of study. When the transducer is the object of study the present invention allows analysis of the mechanical excitation of the transducer. In the case where the transducer is affixed to the object of study, the electric shock applied to the transducer mechanically excites the object on which the transducer is affixed. The electrical shock to the transducer is then stopped and the transducer's signal becomes free to decay naturally or to decay subject to the mechanical excitation from the object. The electric wave emitted by the transducer will include the decay oscillation of the transducer, modulated in amplitude and frequency by the object of study. With the present invention, the voltage in the transducer resulting from the condenser properties of piezoelectric material is eliminated, and the transducer's signal actually decays naturally.

Accordingly, the present invention provides a method of applying and eliminating an initial stress wave and analyzing the characteristics of the signal emitted by the transducer, while it is being allowed to freely oscillate and decay. The wave form of the freely oscillating transducer in this system is a classic decay wave modulated in amplitude and frequency by the static or dynamic external stresses on the crystal. This enables comparison of the waveform of the signal emitted from the transducer without stress to the waveform of the signal emitted by the stressed transducer.

BRIEF DESCRIPTION OF THE DRAWINGS

FIG. 1 is a block schematic representing the apparatus used for analysis of the transducer output signal, according to the present invention.

FIG. 2 is an electrical circuit representing the apparatus used for analysis of the piezoelectric materials output signal, according to the present invention.

FIGS. (A), (B), (C), (D), and (E1), (E2), (E3), are graphs of voltage against time showing the wave form of signals at different points in the circuit described in FIG. 2. A=12; B=15; C=18; D=19; E1, E2, E3,=20—by adjusting the potentiometer(6)

DETAILED DESCRIPTION

The method of testing and analysis employs an electric pulse applied to the transducer, by a square wave generator. The size of the electric pulse varies with the size of the transducer and the object to which it is affixed. The supplied electrical pulse must be of sufficiently large amplitude that it causes an operative transducer to oscillate. The supplied electrical pulse must have a very short time of transit because the piezoelectric material emits a decay signal when the electrical pulse is applied and another decay signal when the electrical pulse is stopped. A square wave generator creates the ideal waveform for the purpose of detecting and analyzing this signal in this method of testing and analysis. The square wave generator is connected to a Shmitt Trigger to ensure optimum pulse waveform. The output of the Shmitt Trigger is connected to a transistor functioning as an electronic switch, so as to have a large impedance when the switch is off. In this circuit it is necessary to ensure that the transducer will not receive any impedance or other influence from the transistor when the switch is off. The output of the transistor is connected to the non-grounded connection of the transducer and to the inverter input of a limit comparator. The function of the limit comparator in this arrangement is to act as a voltage limiter for the square wave impulse while leaving the transducer signal intact.

The transducer signal and the square wave impulse from the transistor travel at the same time to the inverter input of a treshold rectifier. While the transducer signal is amplified, the square wave impulse is reduced to the threshold limit of a rectifier diode. A potentiometer is connected to the non-inverter input of the treshold rectifier, to eliminate the remaining square wave pulse that is below the threshold of the rectifier diode. This leaves the transducer signal as the only signal at the output of the amplifier, all aspects of the square wave pulse having been eliminated. The transducer signal can then be analyzed directly on an oscilloscope, spectrum analyzer, or can be connected to meters, or monitoring circuitry depending upon the specific analysis or application desired.

An apparatus (21) for analyzing the piezoelectric materials (4) output signal is shown if FIG. 2. A square wave generator is connected with the input (11) of a Schmitt Trigger (1), which is electrically connected in series with a PNP transistor (3) at the base (13). A resistor (2) is positioned electrically in series between the output of the Shmitt Trigger (12) and the base of the PNP transistor (13). The emitter (14) of the transistor (3) is connected to the supply voltage VCC (14). The collector (15) of the PNP transistor (3) is arranged in series with the non-grounded connection (15) of the piezoelectric element (4). The other connection of the piezoelectric element (4) is grounded (16). Using a square wave from an external function generator, the Shmitt Trigger (1),the resistor (2), and the transistor (3) are components of a system act to introduce a periodical stress to the piezoelectric element (4), and also mix the signals from the square wave generator and the piezoelectric element (See FIG. 3B). The electric impulse from the transistor is transduced to a mechanical oscillation in the piezoceramic element. The mechanical oscillation is simultaneously transduced in the piezoelectric element to an electrical signal. This is the result of the motor-generator effect of piezoelectric materials. The PNP transistor (3) in this configuration, acts as electronic switch positioned serially with the piezoelectric element, resulting in a small impedance in the "on" position, and very large impedance in the "off" position. The non-grounded connection (15) of the piezoelectric element (4), is arranged in series with an operational amplifier (10) at the inverter input (18). A resistor (7) is positioned electrically in series between the non-grounded connection (15) of the piezoelectric element (4) and the inverter input (18) of the operational amplifier (10). The anode of a silicon diode (8) is connected with the inverter input (18) of the operational amplifier (10). The cathode of the silicon diode (8) is connected with the output (20) of the operational amplifier (10). A resistor (9) is connected between the inverter input (18) and the output (20) of the operational amplifier (10). This circuit comprised of the resistor (7), operational amplifier (10), silicon diode (8) and resistor (9) functions as an amplifier for the piezoelectric element signal and as a treshold rectifier for the square wave impulse. The square wave impulse will be limited to the threshold of the silicon diode, ie. 0.6–0.7 volts. This circuit will amplify the piezoelectric element (4) signal by the ratio of the value of resistor (9) to the value of resistor of (7). As this ratio increases, the piezoelectric element signal will be amplified while the square wave impulse remains fixed. Because the piezoelectric element (4) will act as a condenser and hold DC voltage coming from VCC (14), in this circuit, operational amplifier (10), via the silicon diode (8), also acts as a negative resistor to eliminate the DC voltage remaining in the piezoelectric element.

The anode of a second silicon diode (5) is connected to the non-grounded connection (15) of the piezoelectric element (4). The cathode of the second silicon diode (5) is connected to one connection (17) of potentiometer (6). The other connection of the potentiometer is grounded (16). The middle connection of the potentiometer (6) is connected to the non-inverter input (19) of the operational amplifier (10). This circuit provides the compensation in the non-inverter input (19) of the operational amplifier (10) to eliminate the rest of the square wave impulse at the output (20).

Using a square wave from an external function generator, the apparatus (21) comprised of the above described circuits including the Schmitt Trigger (1), resistor (2), PNP transistor (3), the piezoelectric element (4), the first silicon diode (8), the potentiometer (6), second resistor (7), the second silicon diode (5), the third resistor (9) and the operational amplifier (10), permits precise analysis of piezoelectric materials. The apparatus (21) functions primarily as a piezo interface analyzer. When a piezoelectric material is not bonded or affixed to an object the frequency that is emitted by the piezoelectric element is the resonance frequency of the piezoelectric material, distorted, attenuated or modulated by atmospheric pressure, gravity, radio waves, soundwaves, ultra-sound, static electricity, temperature, and other external forces present in the environment. When these external influences are kept relatively constant, this resonance frequency becomes a standard from which the interface effects on the piezoelectric material can be evaluated. To illustrate the method of analysis, five time periods are relevant, See FIGS. 3A through 3E. First, when the square wave impulse is at maximum and the piezoelectric element is charged this represents the first time period, T1. During this period the piezoelectric element is under stress and emitting a signal. During T2, the square wave impulse is still at maximum, but the piezoelectric element is no longer emitting a signal but is still charged. The duration of T1 plus T2 must be greater than the decay time of the signal emitted by the piezoelectric element. During T3, there is no pulse but the potential of the piezoelectric element decreases to zero volts by virtue of the condenser properties of piezoelectric material. During T4 the piezoelectric material is no longer under stress but is emitting a signal. During T5, the piezoelectric element is no longer under stress nor emitting a signal.

During T1 and T2, the square wave at the output 12 of the Shmitt Trigger (1) is at the low voltage position, See FIG. 3A. The potential at the base (13) of the PNP transistor (3) will be negative enough relative to the emitter to saturate the transistor and the collector of this transistor will go to maximum positive potential. During T1, the piezoelectric element is under constant stress but also emitting a signal, FIG. 3B. During T2, the piezoelectric element is under constant stress but no longer emitting a signal, FIG. 3B. During T1 and T2 the electric potential at the inverter input (18) of the operational amplifier (10) will be positive and the amplitude will be determined by the gain of the operational amplifier (10) and the threshold of the first diode (8).

T3 commences at the moment that the PNP transistor (3) is in the switch off position with respect to the circuit. During T3 the potential at the non-grounded connection (15) of the piezoelectric element (4) has a tendency to go to zero in a time dependent upon the passive capacitance of the piezoelectric element and the parallel resistance of its discharge circuit. During T3 and only during T3, the discharge circuit which is comprised of the second resistor (7), the first diode (8) and the operational amplifier (10) has very little parallel resistance. As a result, during T3 there is a positive potential at the inverter input (18) of the operational amplifier (10), and the output (20) of the operational amplifier (10) will drop below zero and will compensate the resistance of the second resistor (7) plus the resistance of the first silicon diode (8). This shortens the time of discharge of the piezoelectric element acting as a simple capacitor. At the same time both the positive potential at the inverter input (18) of the operational amplifier (10) and output (20) of the operational amplifier (10) reach zero potential, and after this, the external discharge circuit impedance becomes very large. This large impedance eliminates all stress of the piezoelectric element (4) caused by the electrical circuit.

Throughout T4 and T5, the external discharge circuit impedance is large enough to prevent disturbance of the piezoelectric element signal. In order to prevent any distortion of the waveform, the voltage of the signal at the output (20) of the operational amplifier (10) must be lower than the threshold of the first silicon diode (8). At the beginning of T4, the piezoelectric element begins a mechanical oscillation and emits a resulting signal. Throughout T4 the piezoelectric signal decays naturally and is susceptible of being observed during the process of this decay free of all circuit influences. T5 is the remaining time after the signal has fully decayed. In order to properly analyze the signal, T4+T5 must be greater than time required for the signal of piezoelectric material to decay to zero.

During T1 and T2, the second diode (5) and the potentiometer (6) supply the non-inverter input (19) of the operational amplifier (10) with a positive potential to compensate for the positive potential which exists at the same time at inverter input (13). This will maintain the potential at the output (20) of the operational amplifier (10) at zero only during T1 and T2. At other times, the large impedance of the external discharge circuit allows the piezoelectric element (4) free to emit its signal. During T4 and T5, the second diode (5) has very large impedance because the potential at the non-grounded connection of the piezoelectric element (15) is lower than the threshold of the silicon diode. By adjusting the potentiometer (6), the potential at the output (20) of the operational amplifier (10) during T1 and T2 can be positive, negative or zero, (See FIGS. 3E1, 3E2 and 3E3). This adjustment keeps the potential at the operational amplifier output (20) at zero volts during T1 and T2, and only then. Once the piezoelectric element is free of all influence or stress from the electrical circuit, it will begin a mechanical oscillation which will be transduced into an electrical signal. This signal is directly proportional to the quality of the piezoelectric material as a transducer, has the resonance frequency of the material, and is modulated in amplitude and frequency by the interface. This signal is capable of being amplified, FIG. 3E3, and can be analyzed on an oscilloscope, spectrum analyzer, or can be connected to meters, or monitoring circuitry.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. A method for rapidly discharging a direct current ("DC") voltage accumulated by a piezoelectric element, comprising:

(a) applying a DC voltage to the piezoelectric element to place an electrical stress on the piezoelectric element, the electrical stress causing a deformation of the piezoelectric element and causing the piezoelectric element to accumulate a DC voltage component;

(b) stopping applying the DC voltage and discharging essentially all of the DC voltage component from the piezoelectric element before the deformation of the piezoelectric element is converted into an oscillation;

(c) using the oscillation to generate an alternating current ("AC") signal; and (d) outputting the AC signal after essentially all of the DC voltage component has been discharged from the piezoelectric element.

2. The method of claim 1, further comprising repeating steps (a) and (b) for a period at least as long as is required for the AC signal to substantially decay.

3. The method of claim 1, further comprising:

(a) outputting the AC signal, wherein the output AC signal includes essentially none of the DC voltage component;

(b) amplifying the output AC signal; and (c) analyzing the amplified AC signal.

4. A system for forcing a rapid discharge of a direct current ("DC") voltage accumulated by a piezoelectric element, comprising:

(a) a piezoelectric element;

(b) a DC voltage source, coupled to the piezoelectric element and applying a DC voltage to the piezoelectric element to place an electrical stress on the piezoelectric element, the electrical stress causing a deformation of the piezoelectric element and causing the piezoelectric element to accumulate a DC voltage component; and (c) a circuit, coupled to the piezoelectric element and discharging essentially all of the DC voltage component from the piezoelectric element before the deformation of the piezoelectric element is converted into an oscillation, before the oscillation is used to generate an alternating current ("AC") signal, and after the DC voltage source has stopped applying the DC voltage to the piezoelectric element;

wherein the piezoelectric element outputs the AC signal after essentially all of the DC voltage component has been discharged from the piezoelectric element.

5. The system of claim 4 wherein the DC voltage source repeatedly applies the DC voltage to the piezoelectric element and the piezoelectric element is repeatedly discharged after the DC voltage source stops applying the DC voltage to the piezoelectric element for a period at least as long as is required for the AC signal to substantially decay.

6. A method for forcing a rapid discharge of a direct current ("DC") voltage accumulated by a piezoelectric element, wherein the piezoelectric element is affixed to an external object, the method comprising:

(a) applying a DC voltage to the piezoelectric element to place an electrical stress on the piezoelectric element, to cause a deformation of the piezoelectric element and to cause the piezoelectric element to accumulate a DC voltage component;

(b) discharging essentially all of the DC voltage component from the piezoelectric element before the deformation is converted into an oscillation, the oscillation causing the piezoelectric element to generate a decaying, oscillating output signal substantially free of the DC voltage component on the piezoelectric element;

(c) mechanically exciting the external object in response to the DC voltage being applied to the piezoelectric element; and (d) stopping applying the DC voltage to the piezoelectric element;

wherein the decaying, oscillating output signal from the piezoelectric element is responsive to the mechanical excitation of the external object.

7. The method of claim 6 wherein the mechanically excited external object has an amplitude and a frequency, the method further comprising modulating the decaying oscillating output signal by the frequency and amplitude of the external object.

8. The method of claim 6 wherein the piezoelectric element is not affixed to an external object, the method further comprising modulating the piezoelectric element by external forces present in the environment surrounding the piezoelectric element.

9. The method of claim 6, further comprising generating the DC voltage by a square wave generator, such that the DC voltage comprises a square wave with a very short transit time, the square wave having a periodic electric pulse; and wherein the step of applying the DC voltage to the piezoelectric element causes the piezoelectric element to emit a first decay signal when the electric pulse is applied and to emit a second decay signal when the electric pulse is stopped.

10. A method for forcing a rapid discharge of a voltage of a piezoelectric element, comprising:
 (a) applying an electric pulse to the piezoelectric element to cause the piezoelectric element to accumulate a direct current ("DC") voltage;
 (b) generating, by the piezoelectric element, a decaying, oscillating signal in response to application of the electric pulse, at least some of the electric pulse and the decaying, oscillating signal being combined into a combined signal having a pulse component and a decaying, oscillating component;
 (c) eliminating essentially all of the pulse component from the combined signal to obtain an output signal including at least some of the decaying, oscillating component; and
 (d) discharging essentially all of the DC voltage accumulated by the piezoelectric element.

11. A method for rapidly discharging a voltage accumulated by a piezoelectric element to which an electric pulse has been applied, the electric pulse causing the piezoelectric element to accumulate a direct current ("DC") voltage and to generate a decaying alternating current ("AC") signal having a maximum voltage level and a DC component, the method comprising:
 (a) discharging essentially all of the DC voltage from the piezoelectric element before the decaying AC signal is generated;
 (b) amplifying the decaying AC signal;
 (c) limiting the DC component to less than or equal to a threshold voltage to obtain a remaining DC component, the threshold voltage being in a range between about 0 volts and the maximum voltage level; and
 (d) eliminating essentially all of the remaining DC component.

12. A system for rapidly discharging a voltage accumulated by a piezoelectric element, comprising:
 (a) a signal generator for generating at least one electric pulse;
 (b) a piezoelectric element, coupled to the signal generator, such that the piezoelectric element holds an accumulated voltage and generates a decaying, oscillating signal in response to the electric pulse, a combined signal being created from the combination of the electric pulse and the decaying, oscillating signal, the combined signal having a pulse component and a decaying, oscillating component;
 (c) a threshold rectifier, coupled to the piezoelectric element and the signal generator, such that the threshold rectifier limits the pulse component of the combined signal to less than or equal to a threshold voltage level to obtain a remaining pulse component;
 (d) a signal compensation element having an output for generating a compensation signal; and
 (e) an amplifier, coupled to the output of the signal compensation element and to the threshold rectifier, such that essentially all of the remaining pulse component is eliminated from the combined signal to obtain an output signal in response to the compensation signal being output to the amplifier, and such that the amplifier discharges essentially all of the accumulated voltage from the piezoelectric element before the decaying, oscillating signal is generated.

* * * * *